United States Patent [19]

Dupuis

[11] 3,711,625

[45] Jan. 16, 1973

[54] PLASTIC SUPPORT MEANS FOR LEAD FRAME ENDS

[75] Inventor: Jean M. Dupuis, Kanata, Ontario, Canada

[73] Assignee: Microsystems International Limited, Montreal, Quebec, Canada

[22] Filed: April 5, 1971

[21] Appl. No.: 131,108

[30] Foreign Application Priority Data

March 31, 1971 Canada................................109,223

[52] U.S. Cl...............174/52 PE, 29/193.5, 156/261, 156/306

[51] Int. Cl................................................H05k 5/00

[58] Field of Search............174/DIG. 3, 52 S, 52 PE; 29/193, 193.5, 195; 317/234 J, 234 N; 156/261, 306

[56] References Cited

UNITED STATES PATENTS 3,537,175 11/1970 St. Clair et al....................174/52 S X 3,544,857 12/1970 Byrne et al...............174/DIG. 3 UX

*Primary Examiner*—Darrell L. Clay

*Attorney*—L. Brooke Keneford

[57] ABSTRACT

The invention relates to the support and location of lead ends of a lead frame employed in the manufacture of an integrated circuit assembly. The lead ends are partially embedded in a polyimide pad by the action of controlled heat and pressure, and are thus located and supported during subsequent stages in the manufacture of the packaged device.

19 Claims, 6 Drawing Figures inventor JEAN M. DUPUIS agent L. Brooke Lunsford inventor JEAN M. DUPUIS agent L. Brooke Kanford

PLASTIC SUPPORT MEANS FOR LEAD FRAME ENDS

This invention relates to a method of supporting and protecting contact lead ends used in the fabrication of integrated circuit packages.

There are two basic ways in which contact leads may be attached to an integrated circuit device and the resulting device "packaged." The first of these methods is to deposit on a ceramic or similar type of base a pattern of leads leading from the perimeter of the base to a lead region in the center thereof. The device is then located in the center of the base, and the lead pattern is designed so that the frame lead ends will be in registry with connections on or extending from the device. The other ends of the leads extend to the perimeter of the base and are either formed with outwardly extending contact fingers or have such fingers attached thereto in a subsequent step. The base is then encapsulated to form a packaged device. The second basic method is to form the contacts and leads in a frame having a "window" in the center thereof for location and bonding of the device connections to the frame lead ends. The second method is ideally suited for very high volume production but suffers from the disadvantage of extreme fragility. This is a particularly important consideration where the integrated circuit device is a beam-lead device. Typically, the thickness of the lead frame in this case is of the order of 10 mils and preferably, at least at the frame lead ends to which the beam-leads are to be bonded, only 5 mils. This combination is chosen to impart rigidity to the frame whilst the frame lead ends are thin enough to permit bonding to the beam-lead device. Clearly, extreme delicacy of handling is required to ensure that the fine frame lead ends are not bent or otherwise damaged during handling prior to the bonding of the beam-lead device thereto.

Various methods of supporting and protecting the frame lead ends have been tried, for example, gluing a support pad to the lead ends. This has the obvious drawback that a glue must be found which will withstand the temperatures at which the frame lead ends are bonded to the beam-lead device — typically about 400° C. Patents showing various techniques known in the art for performing these methods are, for example, U.S. Pat. No. 3,436,810 (Kaufmann) dated Apr. 8, 1969; U.S. Pat. No. 3,524,249 (Hamada et al) dated Aug. 18, 1970; U.S. Pat. No. 3,431,637 (Caracciolo) dated Mar. 11, 1969; U.S. Pat. No. 3,483,308 (Wakely) dated Dec. 9, 1969, and U.S. Pat. No. 3,484,533 (Kaufmann) dated Dec. 16, 1969. The closest prior art of which applicants are aware is U.S. Pat. No. 3,537,175 (Saint Clair et al) dated Nov. 3, 1970. Saint Clair teaches embedding the frame lead ends in a glass frit so that the lead end surfaces are flush or even beneath the adjacent surface of the frit. However, this method, whilst giving the desired support and protection for the lead ends suffers from two disadvantages — firstly that the glass frit tends to have adverse effect upon the beam-lead device due to ion-migration between the frit and the lead and secondly that embedding the lead ends to their full extent within the frit renders subsequent bonding of the beam-leads difficult. Furthermore, the rough surface of the frit tends to cause movement of the frame lead ends during encapsulation resulting in possible misalignment of the lead ends and beam leads.

In the method of the present invention, a polyimide pad is used to support and protect the frame lead ends, and the ends are embedded within the pad material in order to obviate the need for a bonding medium such as glue. The surfaces of the lead ends are left slightly proud of the pad surface to facilitate bonding of a beam-lead device thereto.

In a preferred embodiment of the invention, the pad is in the form of a disc and the frame lead ends are pressed into the disc under approximately 5 to 10 p.s.i. and at a temperature of approximately 460° C. The frame lead ends are pressed into the disc material to an extent of about half their thickness, the disc being of approximately the same or somewhat less thickness than the frame-lead ends.

In yet a further embodiment of the invention, the pads are produced from a strip of polyimide material by the action of a punch which approaches the strip material from one side, punches out the required pad, and then transports the pad to the bonding location. In this manner, the bonding process is greatly speeded up.

The invention will now be described further by way of example only and with reference to the accompanying drawings, in which.

Figure 1:
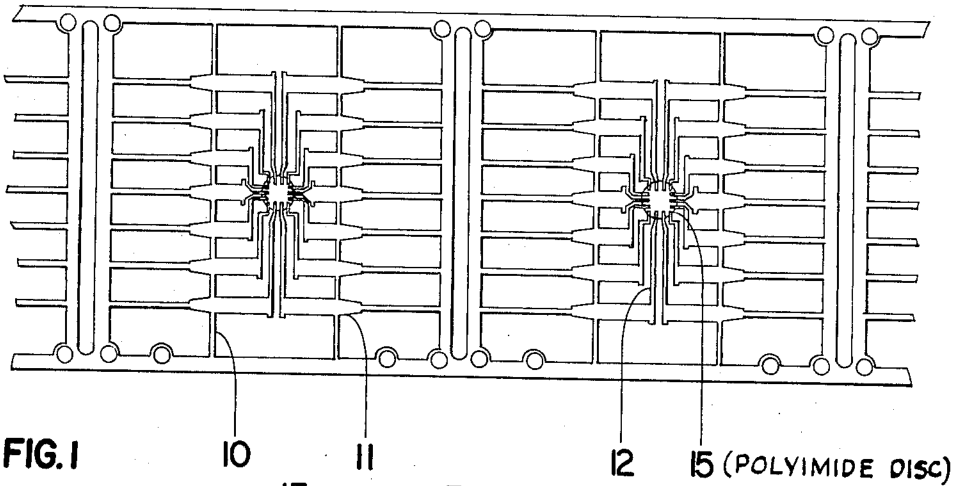
FIG. 1 is a top view of a portion of a lead frame strip treated according to the process of the present invention.
Figure 3:
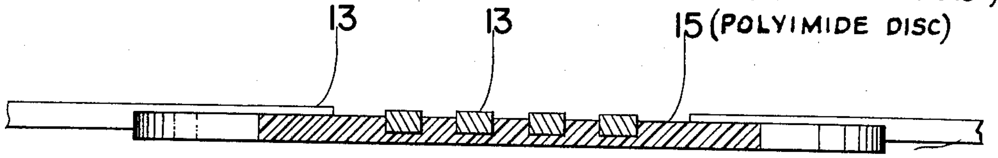
FIG. 3 is a section on the line A—A, FIG. 2.
Figure 2:
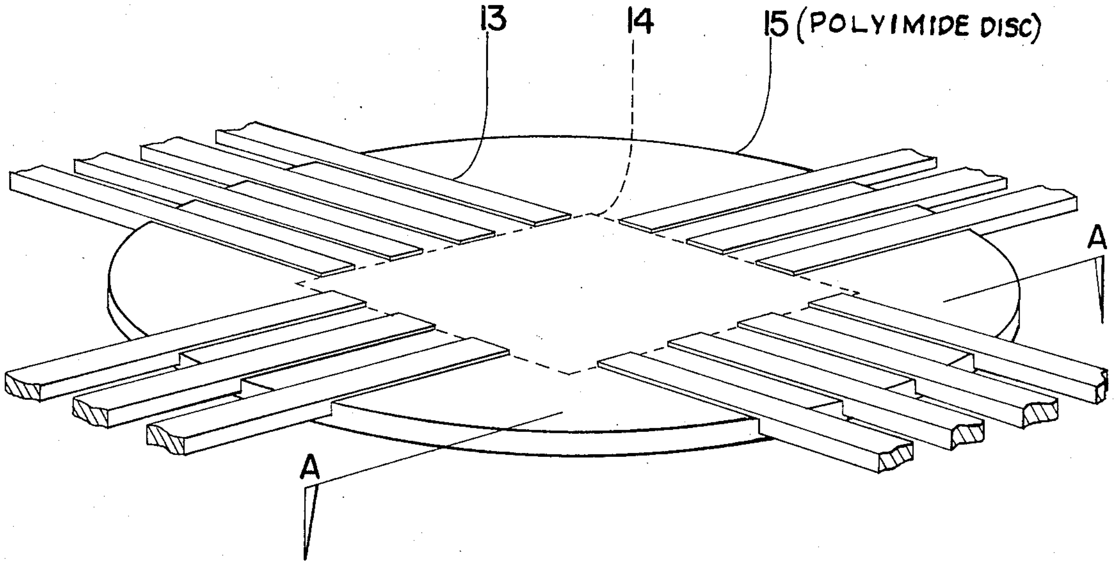
FIG. 2 is a prospective view of the central part of one of the lead frames shown in FIG. 1.

Referring now to the drawings and in particular FIGS. 1, 2 and 3, the lead frames 10 are typically formed in strips of seven, a portion of such a strip being shown in FIG. 1. The frames are each provided with 14 contacts 11, each contact being integral with a frame lead 12. Leads 12 terminate in ends 13, the arrangement of these ends forming a "window" 14 for accomodation of a beam-lead device (see FIG. 2). Typically, the thickness of the frame leads 12 is in the order of 10 mils and the frame lead ends 13 are reduced by etching or milling to a thickness of only 4 or 5 mils. The purpose of this reduction is to facilitate bonding of the beam-lead device to the frame lead ends whilst retaining the strength and rigidity of the 10 mil thick frame lead structure. In the present example, the frame lead ends 13 are 4 mils thick and are embedded to a depth of 2 mils in a polyimide disc 15. The disc is of the order of 2 ½ to 3 mils thick. Thus, the surfaces of the frame lead ends are proud of the disc by approximately 2 mils, thereby permitting the bonding thereto of a beam-lead device. The disc itself is of diameter just sufficient to encompass the frame lead ends 13 of reduced thickness and does not extend to the thicker frame leads 12.

Figure 4:
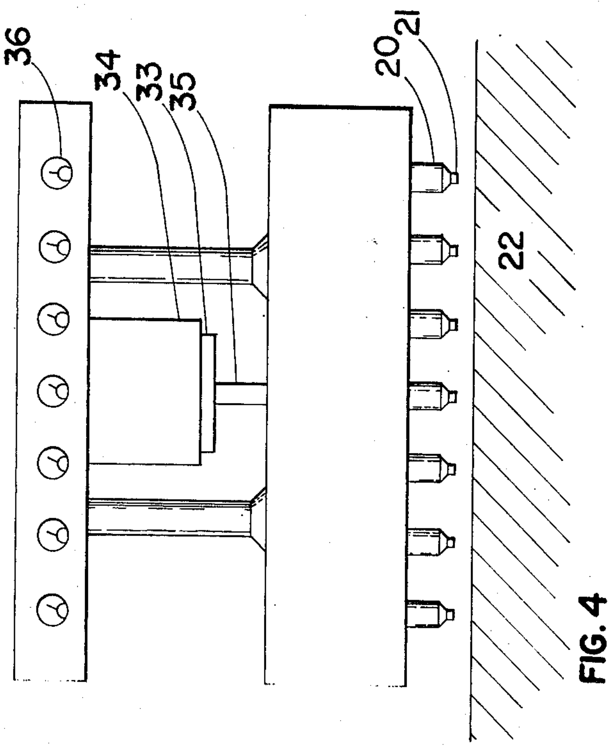
FIG. 4 shows a machine adapted to carry out process of the present invention.

A machine for embedding the frame lead ends into a polyimide disc is shown in FIG. 4 and in this example is adapted to process seven lead frames in one operation. The machine is provided with seven heads 20, spaced at intervals corresponding to the spacing of the windows 14 in the lead frames. Each head is provided with a circular tip element 21 having a flat work-face and a diameter corresponding to the diameter of the discs 15. Each head is further provided with a cartridge heater mounted in a ceramic and nichrome bushing, each bushing being itself mounted in a water-cooled aluminum casting. The temperature of the tip elements is maintained at a constant 460° ± 2° C. The machine is further provided with a work table 22 adapted to receive the lead frames and discs and the heads 20 are simultaneously moveable towards and away from the work table 22 by the action of a mechanically actuated piston 33 moveable within a sleeve 34 and connected to the heads 20 through a pushrod 35 and associated linkage (not shown). Thermostats 36 are provided on the machine to give accurate temperature indication and control of the heater elements of the individual heads 20.

Figures 5, 6:
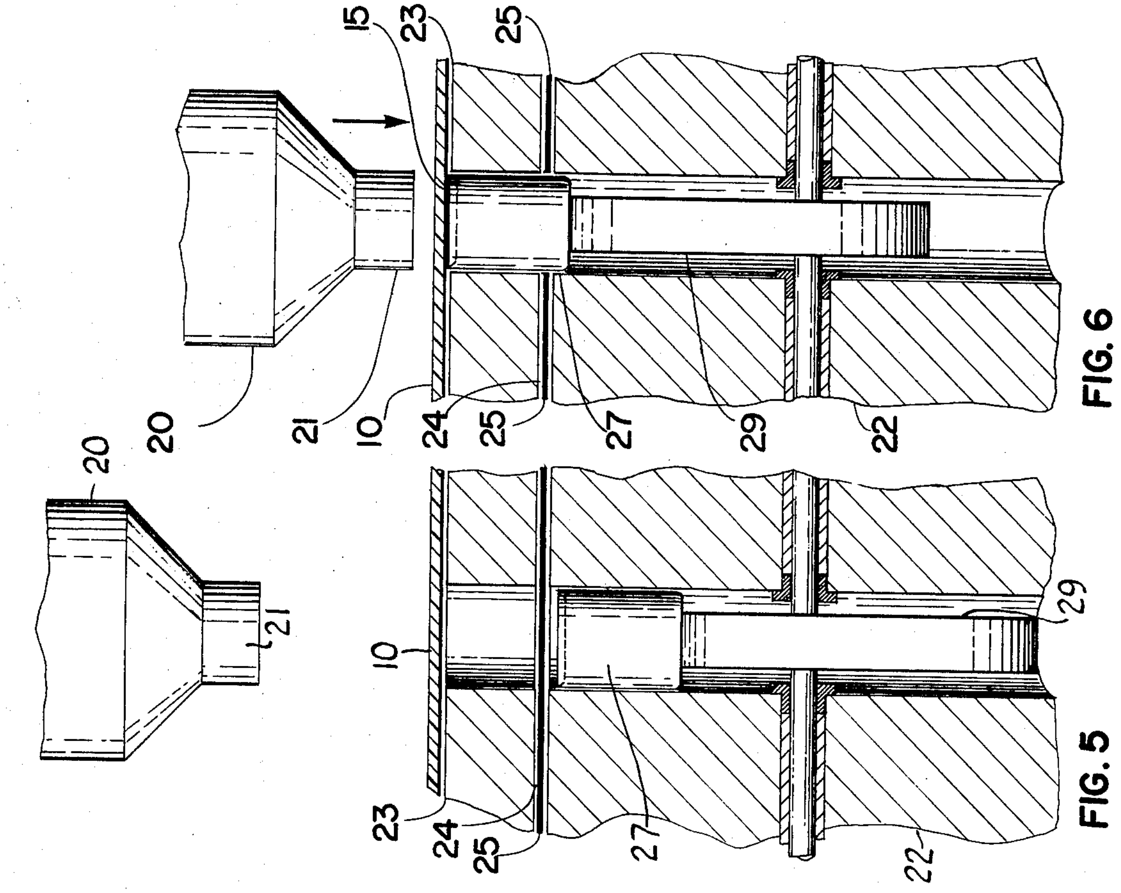
FIGS. 5 and 6 show further details of the machine shown in FIG. 4 at various stages of operation in the process of the present invention.

Turning now to FIG. 5, there is shown a section through the work table of the disc encapsulation machine. For the purpose of illustration, it will be assumed that the surface 23 of the work table 22 is horizontal, and other elements of the machine will be described relative to this plane. The work table is provided with a slot 24, the plane of which is horizontal. The slot 24 is of sufficient width to accomodate a continuous strip of polyimide material 25 from which the encapsulation discs 15 are to be formed, the strip being fed upon demand from a roll feed means (not shown). Beneath each head 20 the work table 22 is provided with a vertical bore 26 extending from the surface of the work table through the plane of the slot 24 and for a sufficient distance thereunder to accomodate a piston 27. The piston 27 is provided with a circumferential cutting edge 28 at its upper extremity. The diameter of the cutting edge 28 is identical to the diameter of the disc 15. The piston is raised by the action of a cam 29 which abuts the lower end of the piston.

In FIG. 5, the piston 27 is shown in its lowered position ready for the severing of the disc from the strip 25 and the presentation of such disc at the surface of the work table 22 to the underside of a beam lead strip 10 placed thereupon. Turning of the cam 29 through 180° forces the piston upwards, whereby the cutting edge 28 cuts a disc of material from the strip 25 and continued upward motion of the piston 27 brings the disc into abutment with the lower surface of frame lead strip 10, as shown in FIG. 6. Strip 10 is of course located so that the disc will contact the desired portion of the frame lead pattern. The head 20 is then brought down so that the heater element 21 contacts the upper surface of strip 10. The element 21 is maintained at 460° ± 2° C. and at this temperature, heat is transferred through the metal of the strip 10 and serves to soften the polyimide disc at the regions of contact thereof with the strip 10 so that further downward movement of the head 20 pushes the strip 10 into the material of the disc 15. The downward pressure required to embed the portions of the strip into the disc is very light indeed and typically is of the magnitude of 5 to 10 p.s.i. The downward movement of the head 20 is carefully controlled by selection of the throw of the mechanical means actuating the main piston 23 in order to ensure that only half the thickness of the strip portion becomes embedded in the disc, thereby leaving the upper surface of the strip proud of the disc and ready for bonding thereto of the beam-lead device. After this operation, each head 20 is raised to the position shown in FIG. 5, and the cam 29 turned through a further 180° to allow the piston to fall back to beneath the slot 24. The polyimide strip 25 is then moved along to bring a fresh strip section into the slot 24 and the treated beam lead strip 10 is replaced by a fresh strip to be processed before the operation is repeated.

Whilst the actuating means for the main piston 23 and the disc cutting pistons 27 have been described as purely mechanical and specifically as cams, it will be realized that the invention is by no means limited to this specific embodiment. One essential feature of the machine is that each tip element and the means for presenting the disc to the beam-lead frame should, at their closest, be sufficiently spaced apart to ensure that the frame lead ends are embedded in the polyimide discs only to the desired depth of the lead ends. Providing close tolerances are maintained, this is relatively easily achieved by mechanical means (such as the cam means specifically described) but it is envisaged that fluid or electrically operating means may also be employed. In order to ensure the limits of travel of the heating elements and disc-cutting pistons, stop means could conveniently be provided where no other precise control over such limits of travel is available.

It will further be realized that the disc configuration for the polyimide support is chosen for convenience only and that the invention is by no means limited thereto. For example, the support pad could equally well be of square or rectangular shape, providing the frame lead ends are encompassed and supported thereby.

Furthermore, although the invention has been described with reference to a lead frame having lead ends of reduced thickness adapted to receive a beam-lead device, it will be appreciated that the invention is also useful for lead frames of uniform thickness and adapted to receive devices having other types of connection — for example, spider-bonding or flip-chip configuration.

What is claimed is:

1. A lead frame having leads with their inner ends terminating in a pattern forming a window adapted to receive and support an integrated circuit device, the improvement where in said inner ends are embedded in a pad of polyimide material, one surface of each such inner end being proud of the adjacent surface of the polyimide material by an amount sufficient to permit bonding to said inner end surface of a connection means associated with said device.

2. A lead frame having leads of a first thickness and inner lead ends of a second reduced thickness, said inner lead ends terminating in a pattern forming a window adapted to receive and support an integrated circuit device having beam leads extending therefrom, the improvement wherein said inner lead ends of reduced thickness are embedded in a pad of polyimide material, one surface of each such inner lead end being proud of the adjacent surface of the polyimide material by an amount sufficient to permit bonding to said inner lead end surface of a beam lead.

3. The combination of claim 2 wherein said polyimide pad is in the form of a disc.

4. A combination as claimed in claim 2 wherein said polyimide pad is in the form of a square or rectangle.

5. A combination as claimed in claim 2 wherein said polyimide pad is of a thickness less than or approximately equal to the thickness of said inner lead ends.

6. A combination as claimed in claim 5 wherein said lead frame is approximately 10 mils thick and about 5 mils thick at the inner lead ends of reduced thickness thereof, the polyimide pad being less than or approximately equal to said inner lead ends in thickness.

7. A combination as claimed in claim 2 wherein said inner lead ends are approximately 4 mils thick and said polyimide pad is between 2 ½ and 3 mils thick.

8. In a process for the manufacture of a lead frame assembly having leads of a first thickness and inner lead ends of a second reduced thickness, said inner lead ends terminating in a pattern defining a window adapted to receive and support an integrated circuit device having beam leads extending therefrom, the improvement which comprises locating a polyimide pad beneath said inner lead ends of reduced thickness and pressing said inner lead ends into said pad at a temperature sufficient to soften said pad material in the regions of said inner lead ends and to an extent that one surface of each such inner lead end remains proud of the adjacent surface of said polyimide pad by an amount sufficient to permit bonding to said one surface of a connection means associated with said device.

9. Process as claimed in claim 8 wherein said temperature is about 460° C.

10. Process as claimed in claim 9, wherein said pad is in the form of a disc.

11. Process as claimed in claim 9, wherein said pad is in the form of a square or rectangle.

12. Process as claimed in claim 8 wherein said lead ends are pressed into said pad under a pressure of between 5 and 10 p.s.i.

13. Process as claimed in claim 12, wherein said pad is in the form of a disc.

14. Process as claimed in claim 12, wherein said pad is in the form of a square or rectangle.

15. Process as claimed in claim 8 wherein said polyimide pad is punched from a strip of polyimide material and presented to the lead frame at one surface thereof and pressure and heat is applied to the other surface of said frame to soften said pad material in the regions of said lead ends of reduced thickness and press said lead ends into said pad material to the required depth.

16. Process as claimed in claim 15, wherein said pad is in the form of a disc.

17. Process as claimed in claim 15, wherein said pad is in the form of a square or rectangle.

18. Process as claimed in claim 8, wherein said pad is in the form of a disc.

19. Process as claimed in claim 8, wherein said pad is in the form of a square or rectangle.

* * * * *